United States Patent
Holcombe, Jr. et al.

(10) Patent No.: US 6,893,601 B2
(45) Date of Patent: May 17, 2005

(54) SURFACE HARDENED CARBON MATERIAL AND PROCESS OF MANUFACTURING

(75) Inventors: Cressie E. Holcombe, Jr., Knoxville, TN (US); Lloyd R. Chapman, Knoxville, TN (US)

(73) Assignee: Equity Enterprises, Oak Ridge, TN (US)

( * ) Notice: Subject to any disclaimer, the term of this patent is extended or adjusted under 35 U.S.C. 154(b) by 48 days.

(21) Appl. No.: 10/372,478

(22) Filed: Feb. 21, 2003

(65) Prior Publication Data

US 2004/0142174 A1 Jul. 22, 2004

Related U.S. Application Data

(63) Continuation-in-part of application No. 10/348,050, filed on Jan. 21, 2003, now Pat. No. 6,830,812.

(51) Int. Cl.[7] ............................................. H05B 6/00
(52) U.S. Cl. .................... 264/446; 264/430; 264/434; 264/447
(58) Field of Search ............................ 264/430, 434, 264/446, 447

(56) References Cited

U.S. PATENT DOCUMENTS

| 3,711,594 | A | * | 1/1973 | Bienert et al. | 264/332 |
|---|---|---|---|---|---|
| 3,914,508 | A | | 10/1975 | Hooton et al. | 428/408 |
| 4,562,050 | A | | 12/1985 | Koeda et al. | 423/290 |
| 4,749,556 | A | * | 6/1988 | Parrish et al. | 423/290 |
| 4,863,649 | A | | 9/1989 | Kawakubo et al. | 264/29.6 |
| 4,892,790 | A | | 1/1990 | Gray | 428/548 |
| 5,064,589 | A | * | 11/1991 | Ichikawa et al. | 264/668 |
| 5,071,797 | A | | 12/1991 | Hida | 501/87 |
| 5,090,969 | A | | 2/1992 | Oki et al. | 51/295 |
| 5,230,718 | A | | 7/1993 | Oki et al. | 51/293 |
| 5,277,973 | A | | 1/1994 | Yamamura et al. | 428/367 |
| 5,286,565 | A | | 2/1994 | Holzl et al. | 428/408 |
| 5,294,382 | A | | 3/1994 | Goldberger | 264/27 |
| 5,298,311 | A | | 3/1994 | Bentson et al. | 428/216 |
| 5,304,397 | A | | 4/1994 | Holzl et al. | 427/249 |
| 5,330,838 | A | | 7/1994 | Dyer et al. | 428/408 |
| 5,368,938 | A | | 11/1994 | Holzl et al. | 428/408 |
| 5,676,723 | A | | 10/1997 | Taniguchi et al. | 65/286 |
| 6,194,650 | B1 | | 2/2001 | Wakayama et al. | 136/256 |
| 6,306,358 | B1 | * | 10/2001 | Yamamoto | 423/290 |
| 6,576,330 | B1 | * | 6/2003 | Schenck et al. | 428/364 |

FOREIGN PATENT DOCUMENTS

JP          10-203807       *    8/1998

OTHER PUBLICATIONS

English abstract of KR 20902051101 published Jun. 2002.*

* cited by examiner

*Primary Examiner*—Archene Turner
(74) *Attorney, Agent, or Firm*—Joseph T. Guy; Nexsen Pruet, LLP

(57) ABSTRACT

A carbon material is formed by heat-treating a carbonaceous material in a reaction mix of oxides of boron and boron nitride in a nitrogen atmosphere to temperatures of 1600 to 2000° C. The surface of the carbonaceous material is transformed into a carbon material that is resistant to oxidation to temperatures of 900° C., enabling machined components to be utilized for weeks at that temperature. The carbon material is also stable in inert or vacuum environments to temperatures in the range of 1500 to 2000° C., enabling its use as aluminum evaporative boats and the like.

21 Claims, No Drawings

SURFACE HARDENED CARBON MATERIAL AND PROCESS OF MANUFACTURING

CROSS-REFERENCE TO RELATED APPLICATION

This application is a C.I.P. U.S. patent application Ser. No. 10/348,050 filed Jan. 21, 2003, now U.S. Pat. No. 6,830,812, incorporated herein by reference thereto.

BACKGROUND OF THE INVENTION

This invention relates generally to carbonaceous materials that have enhanced properties. More particularly, the present invention is related to carbon material that is made oxidation resistant to temperatures of 900° C. The oxidation resistant carbon materials have an electrically non-conducting surface with significantly enhanced surface hardness.

Carbonaceous materials, such as carbon, graphite, carbon-carbon composites, glassy carbon, and the like have many uses. In particular they are useful at high-temperatures where they have excellent mechanical strength. The oxidation of carbonaceous materials in air or oxygen-containing environments at temperatures of 400 to 500° C. has limited its use in high-temperature applications. Otherwise, the easy machinability, low density, good strength, and other properties would lead to carbonaceous materials being the obvious choice.

Oxidation protection of carbonaceous materials has been previously directed to coatings and layers that are utilized to reduce the reaction of oxygen with the materials. Exemplary teachings are provided in U.S. Pat. Nos. 4,711,666 and 4,769,074. Often such layers contain silicon or aluminum to help form glasslike coatings during oxygen attack, whereby the glassy layer or glaze will reduce any additional oxidation of the substrate. An inherent concern with coatings is the thermal expansion mismatches between the substrate and coating that often cause delamination and complete coating spallation.

Another example of oxidation improvement for carbonaceous materials is U.S. Pat. No. 5,368,938, wherein described is the reaction of carbon with gaseous boron oxide to form boron carbide. Still another method of oxidation protection for carbonaceous materials, described in U.S. Pat. No. 5,356,727, is based on "boron carbonitride" designated as CBN, or CBNO if it contains oxygen. CBN is produced by chemical vapor deposition at 700° C. with a mixture of hydrocarbons, boron trichloride and ammonia along with nitrogen or hydrogen carriers at a small fraction of atmospheric pressure, such as a few hundred to a few thousand pascals. The CBN, as described therein, typically has a "metallic appearance" at 50 micrometers thickness.

Graphite has been coated with "pyrolytic boron nitride" to form boats for metal vaporization, as described in U.S. Pat. No. 4,264,803. In such cases, the boron nitride coating was deposited at 1750 to 2300° C. to a thickness of about 250 micrometers or 0.010 inches. It was found that the geometry of the boat cavity and nearly total encapsulation of the boat held the coating onto the substrate. The tendency of the coating of "pyrolytic boron nitride" to delaminate seems to be the main problem with this type of boat.

None of the known technologies for improving the oxidation resistance of carbonaceous materials produces a carbon material that is not a coated surface. Integral materials have heretofore been thought to be difficult to prepare due to the differences in crystal lattice between dissimilar materials. Any blending of materials would generate a unique crystalline lattice which is dissimilar from either starting material. This typically leads to crystallographic defects and dislocations which can create additional, often uncontrollable and unpredictable, crystallographic phases.

In co-pending application Ser. No. 10/348,050 filed Jan. 21, 2003 the formation of an uncharacterized reaction product of boron nitride precursors with carbon was disclosed to have superior products. Efforts to elucidate the reaction mechanism and product formed thereby has led to an alternative approach wherein a material with similar properties and which is believed, without limiting thereto, to be the same material as in our prior application.

BRIEF SUMMARY OF THE INVENTION

A particular feature of the present invention is the ability to form carbonaceous materials with a hardened exterior that is non-conducting.

Another feature is the ability to form a relatively soft carbonaceous item in a desired shape and configuration after which the item can be treated to form an oxidative resistant hard surface without altering the dimensions or structural components of the carbonaceous item.

These and other advantages, as would be realised to one of ordinary skill in the art, are provided in a carbon material produced by heating a carbonaceous material embedded in a mixture of oxides of boron and boron nitride.

Another embodiment is provided in a process for manufacturing a carbon material that has enhanced oxidation resistance and an electrically non-conducting surface. The process involves the steps of embedding a carbonaceous material in a mixture of oxides of boron and boron nitride and heating the embedded carbonaceous material to a temperature in the range of from about 1600° C. to about 2000° C. at one atmosphere pressure with flowing nitrogen.

Yet another embodiment is provided in a surface hardened carbonaceous tool prepared by a process comprising machining a carbonaceous blank into a tool precursor, embedding the tool precursor in a mixture of oxides of boron and boron nitride to form an envelope and heating the envelope to a temperature of at least 1600–2000° C. at one atmosphere of flowing nitrogen to form the carbonaceous tool.

DETAILED DESCRIPTION OF THE INVENTION

The inventors of the present application have developed, through diligent research, a process for forming an integral oxidation resistance region on the exterior of the carbon and the material formed thereby.

Essential to this invention is a means of heat-treating carbonaceous materials in a mixture of oxides of boron and boron nitride.

Boron nitride production processes are well known in the art, typically involving the reaction of boric acid, borates, or boron oxides or the like with ammonia gas or with nitrogen containing compounds such as melamine, urea, dicyandiamide etc. that yield ammonia during heating in nitrogen atmosphere. These processes have been referred to in U.S. Pat. Nos. 4,562,050; 4,784,978; 4,749,556 and 5,854,155. A filler, such as calcium phosphate, may be used, as well as additives such as carbon or boron to affect final purity of the boron nitride powder. However, these processes all involve heating to temperatures of around 1000° C. to produce a "turbostratic" boron nitride that then requires further heating to temperatures of 1600 to 2200° C. to obtain good crystallinity and to reduce residual boron oxide.

The present invention provides a new carbon material. This carbon material is likely a composition of B—N—O—C, resulting from the reaction of those phases present during the heating of oxides of boron and boron nitride with the carbonaceous material buried in the reaction mixture. The type of carbonaceous material can be carbon, carbon-carbon composite, glassy carbon, any type of graphite, or virtually any type of carbon material. Boron oxides vaporize at temperatures above 1300° C. By heat-treating the carbonaceous material in a mixture of oxides of boron and boron nitride, a carbon material is produced with visually the same dimensions and no weight changes from its initial condition. The surface is light grayish-white in appearance. Machined dimensions are retained. Yet the initial carbonaceous material transforms into a distinctly different carbon material, with superior oxidation resistance and an electrically non-conductive surface. The final material is uniquely produced at one atmosphere pressure with flowing nitrogen.

While not limited to any theory, the atmosphere of nitrogen seems to promote the exterior being enriched in the predominantly boron nitride layer. Other atmospheres, such as inert ones like argon and helium, still yield similar results but apparently with somewhat lessened amount of the predominantly boron nitride layer. Even vacuum allows the formation of this converted layer of new carbon material, probably from the gaseous phases reacting. When non-nitrogen atmospheres are used, it is suspected that there may be some amounts of boron carbide formation. Essentially, the phase appears to be a B—N—O—C material whereby the relative amounts of each element depend upon the temperature, time and atmosphere. The depth of conversion of the surface to the new material as well as its stoichiometry also depend on these variables.

According to the present invention, a new carbon material is provided that has many advantages over the prior art. The new carbon material exhibits almost no reaction with air to temperatures of 900° C. for many days. The material is distinctly not a coating but an integral surface treatment that is married to the substrate whereby the dimensions are essentially unchanged from their initial dimensions. Any carbonaceous material can be heat-treated in a mixture of oxides of boron and boron nitrides, preferably in the presence of nitrogen gas at one atmosphere pressure. The converted surface has an affected depth of about 200 micrometers whereas the first 100 micrometers seem to have mostly changed. Visually the surface is light grayish-black.

The amount of boron oxide in the mixture also would change the proportion of the reacting phases in the B—N—O—C environment. The boron oxide should be such that it does not form a glassy mass that prevents or severely reduces its vaporization. In related fashion, the boron nitride amount should be enough to prevent this formation of a glassy mass of boron oxide and does so since boron oxide does not tend to glob up and form a glassy mass while in the presence of boron nitride. These properties are a probable factor in allowing the necessary phases of the B—N—O—C system to interact, leading to the formation of the converted layer of new carbon material. The volume of the mix relative to the graphite parts being heat treated would also affect the surface depth, or case depth, resulting after the process. This is theorized to be due to the need for certain amounts of the reacting phases relative to the surface area of the part or parts being heat treated. In practice it is preferred that the mixture comprises about 1–50%, by weight oxide of boron and about 50–99%, by weight boron nitride. More preferably, the mixture comprises about 5–15%, by weight oxide of boron and about 85–95%, by weight boron nitride.

The procedure is similar to metal heat-treating. Any shaped part or component of a carbonaceous material is placed in the powder mixture of oxides of boron and boron nitride. Any shaped part or component of carbonaceous material can be placed in a powder mixture of boron nitride and an oxide of boron, preferably boron oxide. For example, 10 wt. % of –200 mesh particle size of anhydrous boric acid, or boron oxide, is blended with 90 wt. % boron nitride powder of typical particle size range of 3 to 10 micrometers. Boron nitrides of this size are often agglomerates of particles that are less than 1 micrometers in diameter. A graphite boat or container is used to hold the material. Typically, it is heated in a nitrogen atmosphere to 1900° C. and held for 2 hours. During this heat treatment, boron nitride solid, boron nitride vapor, and boron plus nitrogen in a dissociated fashion are expected to exist from the boron nitride. From the boron oxide, $B_2O_3$, boron monoxide, BO, and the dimer, $B_2O_2$, as well as gaseous $B_2O_3$ are expected to be present to some extent at the highest temperatures. When graphite parts are subjected to the above procedure, weight changes are minimal as are any visual changes in dimensions. Edge retention and shape retention are excellent. Graphite parts visually only have the light grayish-black appearance. The surface is converted to the new carbon material. It is possible that this conversion covers the entire phase diagram across a reaction interface from a solid with gaseous phases. In such a situation, the graphite parts appear to form a primarily boron nitride layer on the outside grading down to graphite on the inside through a layer that is rich in nitrogen down to one that gets richer and richer in carbon until it is just unreacted graphite.

Precursor materials for boron nitride comprise boron compound and nitriding compound which, when heated together, react to form boron nitride. Preferred boron compounds include boric acid, borates, borax, boron oxides, orthoboric acid, metaboric acid, tetraboric acid, lithium borate, potassium borate, sodium perborate, boron trichloride and ammonium borate. It is most preferred that the boron compound be solid. Boron oxides are particularly preferred as the boron compound.

Preferred nitriding compounds include ammonia gas, ammonium chloride, urea, melamine, melam, melem, melon, dicyandiamide, ammelide, guanamines such as acetoguanamine, and nitrogen-compound containing salts such as guanidine hydrochloride, melamine hydrochloride, melamine phosphate or malamine oxalate. Melamine is a particularly preferred nitriding compound.

It is understood that boron oxide can be produced from many precursor materials, such as boric acid and other boron-oxygen containing compounds which yield boron oxide on heating to the temperatures that are required for the heat-treatment described herein.

For graphite parts subjected to the above procedure, weight changes are minimal as are any visual changes in dimensions. Edge retention and shape retention are excellent. Graphite parts would be tested in an air furnace for oxidation to 10% weight loss. This is a standard measurement used to compare effectiveness with graphite oxidation improvements. Oxidation would essentially be stopped at 750° C., with no observable weight change after 400 to 500 hours. At 900° C., weight loss would reach 10% after 18 to 20 days.

By post-heating in air for 1000° C. for 1 hour up to 24 hours or so and then testing the oxidation at lower temperatures, such as 750° C., the oxidation resistance would be enhanced. At 750° C., the time to reach 10% weight loss would be approximately 2000 hours or 80 to 90 days.

Testing of the heat-treated carbon material in vacuum at 1500° C. showed no weight, dimensional, or visual changes. The surface remained electrically nonconductive in all cases.

The surface of the new carbon material is not soluble in water or methyl alcohol. While not restricted to any theory regarding the actual chemical composition of the surface and immediate interior the insolubility indicates that the inventive phase is different chemically from boron oxide/boric acid phases. The lack of vaporization at 1500° C. also indicates significant differences from boron-oxygen compounds. The oxidation stability in air greatly exceeds boron nitride. The visual appearance suggests that the new carbon material is probably likely a composition of B—N—O—C, which results from the reaction of those phases present in the boron nitride production processes or in a heated mixture of oxide of boron and boron nitride reacting with the carbonaceous material that is buried in the reaction mixture.

Any type of carbonaceous material is similarly affected, whether it is carbon, carbon-carbon composite, glassy carbon, carbon or graphite felt, flexible graphite foil (grafoil) such as described in U.S. Pat. No. 3,404,061, or any type of graphite. It appears that the reactive phases from boron nitride production processes react with carbon to produce a carbon material that is unique and not yet characterized herein. The many phases of boron-nitrogen-oxygen-carbon that can be present in liquid, vapor, or gaseous states prohibit the determination of the mechanism of the production of this new carbon material. Since boron carbide does not form in the nitrogen atmosphere that is used for boron nitride production processes, that may drive the composition towards a boron-nitride-like phase. This would account for the observed light grayish-white color, definitely not metallic appearing. Visually, there is no change in the outer dimensions or shape which suggest, without limiting the scope herein, some type of substitution reaction within the crystal lattice of the carbon. Even screw threads are not affected by the heat-treatment and transformation to the new carbon material. The final carbon material does not act in any way like a coated part.

The observed properties of this new carbon material greatly enhance the potential utility of carbonaceous materials. The surface created with this invention is like a "deep-case" treatment for metals, where the treated surface is integrally bonded to the substrate, essentially married to the substrate and not acting as an independent layer or coating. The underlying carbon has the properties of normal carbon and thus has electrical conductivity that is characteristic of whatever species of carbon is utilized, enabling both electrically conductive and nonconductive surfaces to be available. The affected surface region from the heat-treatment is electrically nonconductive, but that layer can be machined down to leave material that has the characteristics of the un-heat-treated substrate carbonaceous material. For graphite, the substrate is highly electrically conductive.

It should be noted that the affected surface is much harder than normal graphite or carbon materials or normal hexagonal boron nitride. The surface is easily ground down with silicon carbide wheels, thus indicating it to be softer than silicon carbide.

Graphite electrodes used for steelmaking have significant consumption due to surface oxidation. This can be prevented with the carbon material of this invention. Electrical conductivity can be achieved by clamps that penetrate the surface to achieve electrical contact with the underlying electrically conductive graphite substrate which remains chemically unaltered in the present process.

Evaporation boats can be made that are usable in vacuum conditions to 1500° C. and above due to the stability of the surface of this carbon material. There are no problems with delamination since the surface is tightly bonded to the substrate, essentially as if there is no coating but just an extension of the material. Areas needing electrical conductivity, such as where clamping is desired, can be made electrically conductive by machining away the electrically nonconductive affected surface region to expose the electrically conductive graphite substrate.

For electrical-discharge machining (EDM) electrodes used for hole-drilling, the sides need to be electrically nonconductive while the cutting surface needs to be electrically conductive. This is also achieved by machining away the electrically nonconductive affected surface region to expose ,the electrically conductive graphite substrate.

For greatly extended life, pump components, injection tubes, paddles, stalk tubes, etc. used for nonferrous metal melting and casting can be made of this new carbon material. The enhanced oxidation resistance, hardness, and electrical nonconduction of the affected surface provide new usefulness for carbonaceous materials.

A flash evaporator could be prepared in accordance with the invention described herein. The heating cycle would be about 2 hours at 950° C. and about 2 hours at about 1900° C. The flash evaporator would be cross-sectioned for visible inspection. The visible appearance would indicate that the chemical transformation was about 200 to 300 micrometers into the carbon. Increasing the time, temperature and exposure would be expected to increase the thickness of the converted layer.

Braided graphite, available as braided flexible graphite packing, would be treated in accordance with the present invention. The material would become less flexible yet the shape and appearance substantially unchanged. Oxidation properties would be consistent with the present invention.

A sample of 0.1 to 0.125 thick piece of grafoil could be treated in accordance with the present invention. The oxidation properties would be improved without loss of shape or size.

For a graphite part resulting from the mixture of 10 wt. % boron oxide with boron nitride, its oxidation resistance was tested in an air furnace for oxidation to 10% weight loss. This is a standard measurement used to compare effectiveness with graphite oxidation improvements. Oxidation was reduced considerably at 750° C. with no observable weight change after several hundred hours. At 900° C., weight loss reached 10% after several weeks.

By a post-heating in air at 1000° C. for 1 hour up to about 24 hours or so and then testing the oxidation at lower temperatures, such as 750° C., the oxidation resistance is enhanced. At 750° C., the time to reach 10% weight loss could be increased up to ten times.

Testing of the heat-treated carbon material in vacuum at 1500° C. showed no weight, dimensional, or visual changes. The outer surface remained electrically non-conductive in all cases, yet the outer layer could be ground down to a shiny underlayer that was electrically conductive.

A comparative example was prepared to demonstrate the effects of perturbations in the reactants. An example of perturbation of the reactants was shown by adding 1% amorphous boron to the reaction mixture above. The layer formation was reduced to almost nonexistent. This is believed to be from the upsetting of the relative phases in the mix. Carbon would be expected to have a similar effect due to its tendency to reduce oxygen-containing species like boron.

While preferred embodiments have been shown and described, it will be understood that it is not intended to limit the disclosure, but rather it is intended to cover all modifications and alternate methods falling within the spirit and the scope of the invention as defined in the appended claims.

The invention has been described with particular emphasis on the preferred embodiments. It would be realized from the teachings herein that other embodiments, alterations, and configurations could be employed without departing from the scope of the invention which is more specifically set forth in the claims.

What is claimed is:

1. A process for manufacturing a carbon material that has enhanced oxidation resistance, involving the steps of:
   embedding a carbonaceous material in a mixture of boron nitride and an oxide of boron wherein the ratio of boron nitride to oxide of boron is sufficient to prevent formation of a glassy mass of boron oxide; and
   heating the embedded carbonaceous material to a temperature in the range of from about 1600° C. to about 2000° C. at one atmosphere pressure with flowing nitrogen.

2. The process of claim 1 wherein said carbonaceous material is selected from graphite, carbon, carbon-carbon composite, glassy carbon, and grafoil.

3. The process of claim 1 wherein said oxide of boron comprises at least one boron compound selected from boric acid, borate, boron oxide, borax, and sodium perborate.

4. The process of claim 3 wherein said oxide of boron comprises at least one compound selected from boric acid, borates, boron oxides and borax.

5. The process of claim 1 wherein said mixture comprises about 1 to about 50%, by weight oxide of boron.

6. The process of claim 1 wherein said mixture comprises about 50–99%, by weight boron nitride.

7. The process of claim 1 wherein said heating forms an electrically non-conducting surface of at least about 100 microns thick.

8. The process of claim 7 wherein said electrically non-conducting surface is at least about 200 microns thick.

9. The process of claim 1 wherein said carbonaceous material is selected from carbon felt and graphite felt.

10. The process of claim 1 wherein said oxide of boron comprises at least one boron compound selected from orthoboric acid, metaboric acid, tetraboric acid, lithium borate, potassium borate, and ammonium borate.

11. A process for manufacturing a carbon material that has enhanced oxidation resistance, involving the steps of:
    embedding a carbonaceous material in a mixture of boron nitride and an oxide of boron; and
    heating the embedded carbonaceous material to a temperature in the range of from about 1600° C. to about 2000° C. at one atmosphere pressure with flowing nitrogen wherein said mixture comprises about 5–15%, by weight oxide of boron and about 85–95%, by weight, boron nitride.

12. A process for manufacturing a carbon material that has enhanced oxidation resistance, involving the steps of:
    embedding a carbonaceous material in a mixture of boron nitride and an oxide of boron; and
    heating the embedded carbonaceous material to a temperature in the range of from about 1600° C. to about 2000° C. at one atmosphere pressure with flowing nitrogen wherein said mixture comprises 1–50%, by weight oxide of boron and 80–99%, by weight, boron nitride.

13. The process of claim 12 wherein said carbonaceous material is selected from graphite, carbon, carbon-carbon composite, glassy carbon, and grafoil.

14. The process of claim 12 wherein said oxide of boron comprises at least one boron compound selected from boric acid, borate, boron oxide, borax, and sodium perborate.

15. The process of claim 14 wherein said oxide of boron comprises at least one compound selected from boric acid, borates, boron oxides and borax.

16. The process of claim 12 wherein said mixture comprises about 5 to about 15%, by weight oxide of boron.

17. The process of claim 12 wherein said mixture comprises about 85–95%, by weight boron nitride.

18. The process of claim 12 wherein said heating forms an electrically non-conducting surface of at least about 100 microns thick.

19. The process of claim 18 wherein said electrically non-conducting surface is at least about 200 microns hick.

20. The process of claim 12 wherein said carbonaceous material is selected from carbon felt and graphite felt.

21. The process of claim 12 wherein said oxide of boron comprises at least one boron compound selected from orthoboric acid, metaboric acid, tetraboric acid, lithium borate, potassium borate, and ammonium borate.

* * * * *